United States Patent [19]

Gruner

[11] 3,765,015

[45] Oct. 9, 1973

[54] SWITCH MONITORING CIRCUITRY

[75] Inventor: Ronald H. Gruner, Framingham, Mass.

[73] Assignee: Data General Corporation, Southboro, Mass.

[22] Filed: Sept. 20, 1971

[21] Appl. No.: 181,955

[52] U.S. Cl.. 340/365 E, 307/247 A, 340/146.1 AB

[51] Int. Cl. .............................................. G06f 3/02

[58] Field of Search............... 340/365 E, 146.1 AB; 307/247 A

[56] References Cited

UNITED STATES PATENTS

| | | | |
|---|---|---|---|
| 3,631,473 | 12/1971 | Yakata | 340/365 E |
| 3,576,569 | 4/1971 | Watson | 340/365 E |
| 3,660,838 | 5/1972 | Goue | 340/365 E |
| 3,624,645 | 11/1971 | Gluck | 340/365 E |

*Primary Examiner*—John W. Caldwell
*Assistant Examiner*—Robert J. Mooney
*Attorney*—Sewall P. Bronstein et al.

[57] ABSTRACT

A system for monitoring the operation of a plurality of switches which are each connected in series with a resistor, the plurality of switch-resistor circuits being connected in parallel and in turn connected at a common point through a common resistor to a reference voltage source. In a preferred embodiment, a detector circuit is connected to the common point and is used to detect the change in voltage thereat when one or more of the switches is activated so as to provide an output voltage when such change is detected. The detector includes time delay circuitry for producing such output voltage only after the switching transient oscillation decays to a negligible value. The output voltage from the detector may be used to provide for the enabling of additional circuitry in response to such activation of one or more of the switches. If desired, an additional detector may be used to prevent such enabling when more than one switch has been activated simultaneously.

6 Claims, 3 Drawing Figures

SWITCH MONITORING CIRCUITRY

INTRODUCTION

Figure 1:
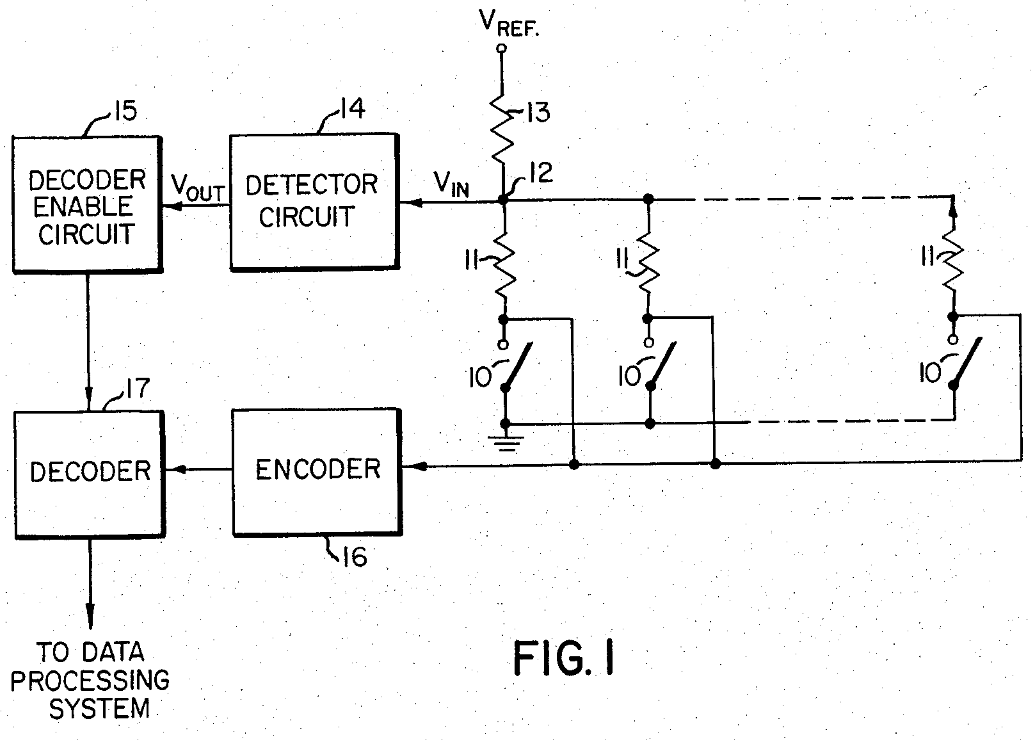

This invention relates generally to switch monitoring circuitry and, more particularly, to circuitry for determining when one or more of a plurality of switches in a system is actuated.

Many electrically operated systems and apparatus utilize a plurality of switches, often connected in parallel, to actuate various circuitry in accordance with the particular switch which is activated. For example, in data processing systems a console for controlling the overall data processing operation may include a plurality of switches which are appropriately actuated to effect such control. Thus, for example, when a particular switch is closed, the data processing system is provided with a suitable command signal for performing a desired processing operation. In such systems it is necessary to know when one of a plurality of switches has been activated so that the circuitry for producing the desired command signal can be enabled and the desired operation performed. In order to assure that the information as to switch closure is correct, it is also necessary to assure that the detection of switch activation and, hence, the enabling of the appropriate command circuitry be made after the initial switching transient has died out.

DESCRIPTION OF THE PRIOR ART

In prior art switch monitoring systems, particularly those used in data processing console operation, a separate detector circuit is usually used in association with each switch whose operation is to be monitored. Appropriate scanning or commutation circuitry is then used to monitor the output of each individual detector circuit sequentially to determine when a switch has been activated. Such a system is relatively costly because of the relatively large number of detector circuits and scanning circuitry which is required. Further, the various interconnections needed between the many elements of the prior systems, i.e., the switches, the detector circuits and the scanning circuits, tend to reduce the reliability of the overall monitoring system.

DESCRIPTION OF THE INVENTION

In the system of the invention the costs are considerably reduced over that of prior art systems and the reliability is increased because of the use of fewer components. Thus, in a particular embodiment of the invention, the switches of a console system are connected in parallel in an appropriate resistance circuit wherein each switch is connected in series with a resistance having a selected value and the parallel arrangement of such resistances and switches is connected to a voltage reference source through a common resistor. The junction point of the common resistor and the interconnected resistors associated with each switch is then connected to a single detection circuit which produces an output voltage when the input voltage thereto changes from the reference voltage value to a new value when one of the switches of the parallel configuration is closed. The detection circuit includes appropriate means, such as an integrator circuit or a time delay circuit, for example, which prevents the detector from producing its output signal until the initial transient portion of the changed signal at the input thereto has decayed to an appropriately negligible value.

In a particular embodiment of an overall monitoring system, for example, each switch may be connected to an appropriate encoding circuit which produces an encoded output signal when one of the switches in the overall configuration is closed. The form of the encoded signal depends upon which one of the switches is activated and such signal is fed to a suitable decoder circuit for providing the desired command signal. The decoder circuit is enabled for operation in accordance with the output of the detection circuit so that the decoded signal is fed to the data processing system to command the desired operation thereof only when such enabling has occurred.

Figure 2:
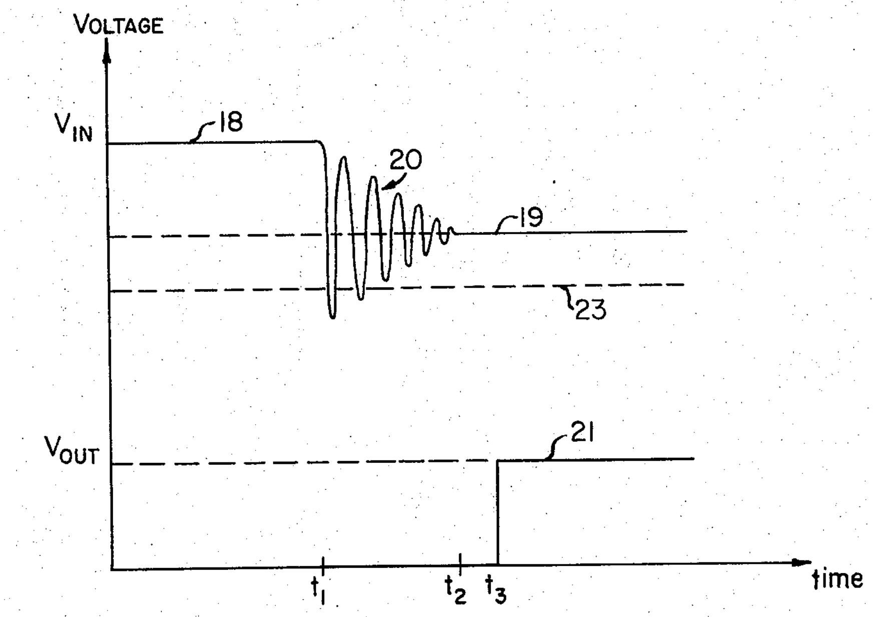
Figure 3:
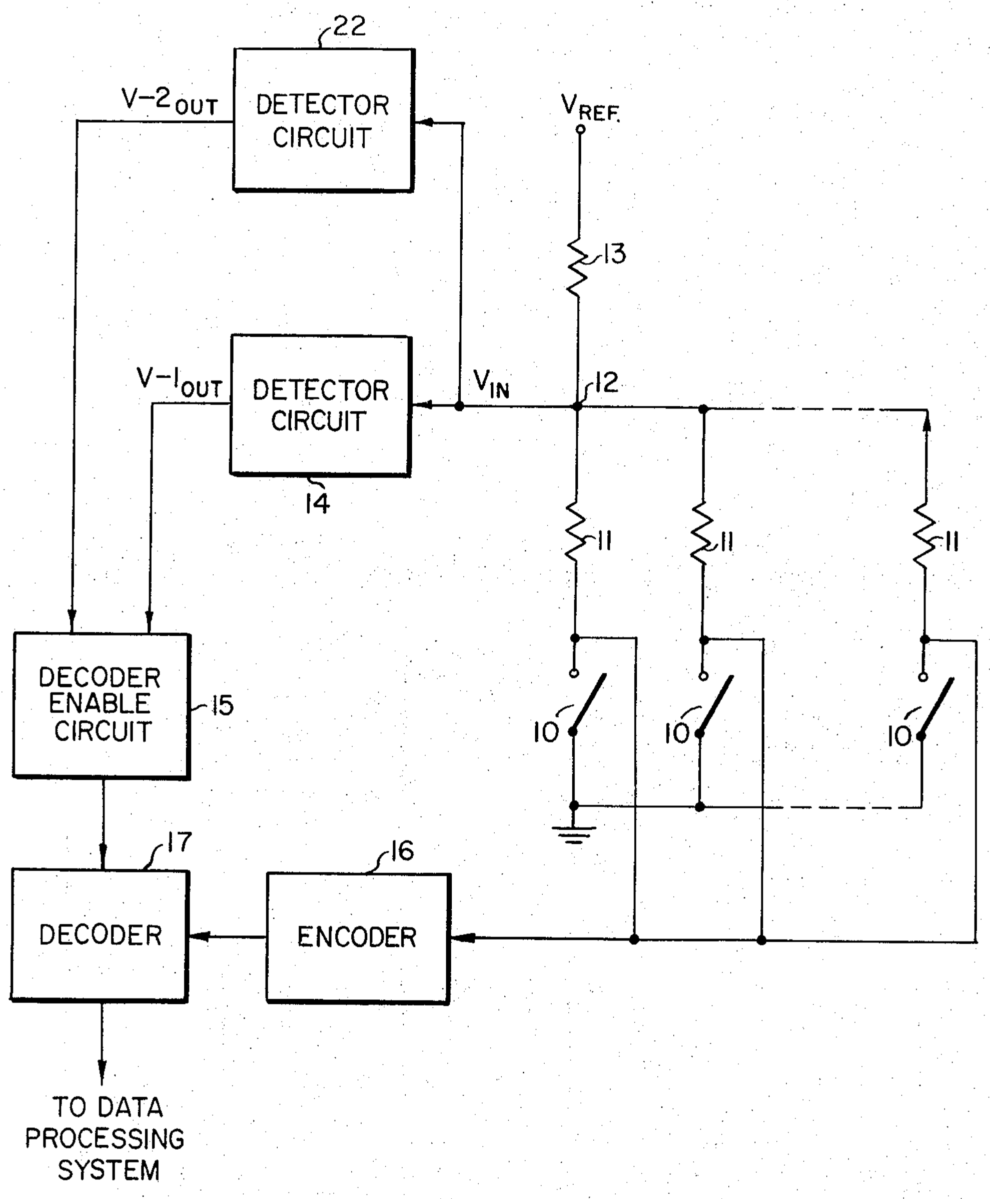

The invention is described in more detail with the help of the accompanying drawings wherein FIG. 1 shows a partial block diagram and partial schematic diagram of a monitoring system in accordance with a particular embodiment of the invention for use in a data processing system;

FIG. 2 shows a graph of the critical voltages in the switch monitoring system of FIG. 1; and FIG. 3 shows an alternate embodiment of a switch monitoring system in accordance with the invention.

In FIG. 1 a plurality of switches 10 are shown connected to one side thereof to a common reference point, such as ground. The other end of each switch is connected to individual resistors 11, which resistors are in turn connected at the other end to a common point 12. A reference voltage source $V_{REF}$ is connected to common point 12 through a common resistor 13.

A detector circuit 14 is connected at its input to point 12 and the output thereof is connected to a decoder enable circuit 15,for purposes described below.

The ungrounded sides of each switch are connected to an encoder 16, the output of which is connected to a decoder 17 which is put into operation by decoder enable circuits 15 to which it is connected as discussed below. The decoder 17 provides an output command signal which can then be fed to a data processing system for commanding the actuation of a desired data processing operation.

In the operation of the monitoring system of FIG. 1 it is desired to determine when one of the switches 10 is closed, for example. If all switches are in an open position, the voltage at common point 12 is equal to the reference voltage $V_{REF}$. The detector circuit 14 is arranged so that when the input signal thereto is at a specified value, or greater, no output signal is produced therefrom. When one of the switches 10 is closed, current flows through the switch and its associated resistor 11 so that a voltage drop occurs thereacross and produces a lower voltage at common point 12, such voltage having a value depending on the values of resistor 11 and resistor 13. In accordance with the operation of detector circuit 14, when its input signal drops below a specified value, an output signal is produced for actuating the decoder enable circuit 15.

Thus, upon the activation of a switch 10, the voltage $V_{IN}$ at the input of detector circuit 14 accordingly changes from a first value, as shown in FIG. 2 by reference numeral 18, to a second value as shown in the same figure by reference numeral 19. At the first value 18, no output signal $V_{OUT}$ occurs from detector 14, while at the second value 19, an output signal 21 occurs therefrom.

As seen therein, if such switch is closed at time $t_1$ an initial transient condition (i.e., a rapid oscillation) occurs before the voltage settles to its relatively stable, or fixed value at 19. The transient portion 20 may last, for example, for the time period from $t_1$ to $t_2$. An appropriate integrating circuit, or a time delay circuit, within detector circuitry 14 can be used to prevent the production of the output voltage $V_{OUT}$ from detector circuit 14 until the transient portion 20 of input voltage $V_{IN}$ has effectively decayed to a negligible value. Accordingly, the production of an output voltage from detector circuit 14 which is sufficient to actuate decoder enable circuit 15 does not occur until a suitable time $t_3$ after time $t_2$ as determined by the integrator or time delay circuitry in detector 14.

In the particular application described in FIG. 1 each of the switches, for example, may be connected to the input of encoder circuit 16 which is arranged, for example, to produce a binary output signal, the form thereof depending on which one of the plurality of switches 10 is thrown. For example, if sixteen switches are used in the console switch configuration, the encoder may be arranged in a manner well known to those in the art to produce a 4-bit binary signal, the binary configuration of such encoded signal being different for each of the sixteen conditions under which one of the switches is closed.

It should be understood that the signals from the switches need not be supplied to the data processing system in binary encoded form and any appropriate encoder (and subsequent decoder) known to those in the art may be used to generate an appropriate command signal for the data processor. Moreover, the signals from switches may be used in non-encoded form for appropriate use by the data processing system and, hence, the invention is not necessarily limited to the particular embodiment shown and discussed here.

The encoded signal from encoder 16 is then fed to an appropriate decoder circuit 17 which is of a form well known to those in the art and which produces the desired command signal for the data processor in accordance with the form of the encoded signal. The decoder is not permitted to operate, however, until it has been appropriately enabled following the detection of a condition which indicates that one of the console switches has been activated. The decoder circuit 15, which, for example, may be a gate circuit of any appropriate well-known form, is suitably actuated as discussed above by the change in the output signal from detector circuit 14 to produce a signal for gating the decoder 17 "on" so as to decode the signal from encoder 16 and to produce an output command signal.

Thus, the above configuration for monitoring the closure of one of a plurality of switches, first of all, provides a determination, that one of the plurality of switches has been closed and, secondly, assures that the switch closure has been fully completed and the transient conditions fully decayed before a command signal is fed to the data processing system.

The above configuration can be modified in order to prevent the enabling of decoder circuit 7 if more than one of the switches 10 has been closed at the same time. In data processing operation it may be desirable, for example, that a command signal be fed to a data processing system upon the closure of one of a plurality of switches but that no command signal be furnished to the data processing system if more than one switch is closed simultaneously. Such a modification is shown in FIG. 3 wherein similar elements are identified by the same reference numerals as used in FIG. 1.

As can be seen therein, a second detector circuit 22 is also connected to the common point 12 and produces an output signal which is fed to the decoder enable circuit 15. The purpose of detector circuit 22 is to prevent activation of decoder enable circuit 15 and, hence, to prevent the enabling of decoder 17 when more than one of the switches 10 is closed. Thus, if it is assumed that a single switch is closed, the value of the voltage $V_{IN}$ at common point 12 and, hence, at the inputs to detector circuits 14 and 22 will assume a value such as that shown at reference numeral 19 in FIG. 2. As discussed above, such a change in the input signal to detector circuit 14 causes the latter to produce an appropriate output signal $V\text{-}1_{OUT}$ which is supplied to decoder enable circuit 15 to activate the latter unit and, in turn, to enable decoder 17.

The input operating threshold of second detector circuit 22, however, is arranged so that it will not produce an output signal until the input signal thereto is at a selected value such as shown by reference numeral 23 below that shown by reference numeral 19. Accordingly, if only a single switch is activated, detector circuit 22 does not operate to produce an output signal for feeding to decoder enable circuit 15.

However, should more than one of the switches 10 be activated, the value of the voltage at common point 12 is reduced to such selected value 23, or lower, which value is below the value shown at reference numeral 19 of FIG. 2 and, accordingly, both detector circuit 14 and detector circuit 22 are caused to operate and to produce appropriate output signals. The output signal $V\text{-}2_{OUT}$ from detector circuit 22, however, can be supplied to decoder enable circuit in such a manner as to prevent activation thereof, even though the output signal $V\text{-}1_{OUT}$ from detector circuit 14 is present. Thus, the presence of an output signal from detector circuit 22 is arranged, as is well known to those in the art, to prevent the enabling of decoder 17 if more than one switch 10 is closed but not to prevent the enabling of decoder 17 if only a single switch 10 is closed. The operation of detector circuit 22 is similar to that of detector circuit 14 in that appropriate integrator or time delay circuitry is used therein to provide an output signal only when the initial switching transient has decayed to a negligible value. The time delay utilized in the circuitry of detector 22 is shorter than than utilized in the circuitry of detector 14 so that the response of detector 22 to the simultaneous closure of more than one switch is faster than the response of detector 14 and prevention of the enabling of decoder 17 is assured under multiple switch closure conditions.

Although in the preferred embodiments shown resistors are depicted in the switching circuitry, any appropriate impedance means may be used therein. Moreover, the values of such impedances all may be made equal to each other in a preferred embodiment although it is understood that different values may be selected therefor if desired.

What is claimed is:

1. A switch monitor system for determining when one or more of a plurality of switches is activated, said system comprising a plurality of switch circuits each including a switch and an impedance means connected in series therewith, such switch circuits being connected in parallel with each other and having first and second common connection points, said impedance means being directly connected to said second common connection point;

said first common connection point being connected to a reference point;

a reference voltage source;

a common impedance connected between said reference voltage source and said common connection point, the voltage at said second common connection point having a first value when none of said switches is activated and a second value when one of said switches is activated;

detector means having its input connected to said second common connection point for detecting the change in voltage at said second common connection point from said first value when none of said switches is activated to said second value when one of said switches is activated;

encoder circuitry connected to said plurality of switch circuits for producing an encoded signal when one of said switches is activated;

decoder circuitry for decoding said encoded signal; and decoder enabling circuitry responsive to the output of said detector means for enabling said decoder circuitry when one of said switches is activated.

2. A switch monitor system as in claim 1 wherein each said series impedance means and said common impedance means are resistors.

3. A switch monitor system in accordance with claim 1 wherein the impedance values of each said series impedance means are substantially equal.

4. A switch monitor system in accordance with claim 1 wherein said voltage change at said second common connection point produces a transient oscillation when one of said switches is activated, which transient oscillation decays before reaching said second value; and further wherein said detector means produces an output signal only when said transient oscillation has decayed to a predetermined value.

5. A switch monitor system as in claim 1 wherein the voltage at said second common connection point has a third value, or lower, when two or more of said switches are activated and further including a second detector means having its input connected to said second common connection point for detecting the change in voltage at said second common connection point to a third value, or lower, when two or more of said switches are simultaneously activated; said decoder enabling circuitry being further responsive to said second detector means for preventing the enabling of said decoder circuitry when two or more of said switches are activated.

6. A switch monitor system as in claim 5 wherein said voltage change from said first value to said third value, or lower, produces a transient oscillation which decays before reaching said third value, or lower, and said second detector means includes means for producing an output signal only when said transient oscillation has decayed to a predetermined value.

* * * * *